(12) United States Patent
Kim et al.

(10) Patent No.: US 11,316,309 B2
(45) Date of Patent: Apr. 26, 2022

(54) CONNECTOR ASSEMBLY COUPLED TO A SIDE OF CIRCUIT BOARD

(71) Applicant: SENSORVIEW CO., LTD., Gyeonggi-do (KR)

(72) Inventors: Byoung Nam Kim, Gyeonggi-do (KR); Kyoung Il Kang, Gyeonggi-do (KR); Dong Il Yim, Gyeonggi-do (KR); Sung Cheol Cho, Incheon (KR); Ji Hun Kang, Gyeonggi-do (KR)

(73) Assignee: SENSORVIEW CO., LTD., Gyeonggi-do (KR)

( * ) Notice: Subject to any disclaimer, the term of this patent is extended or adjusted under 35 U.S.C. 154(b) by 0 days.

(21) Appl. No.: 17/178,428

(22) Filed: Feb. 18, 2021

(65) Prior Publication Data

US 2021/0273385 A1 Sep. 2, 2021

(30) Foreign Application Priority Data

Feb. 27, 2020 (KR) .................... 10-2020-0024374

(51) Int. Cl.
*H01R 24/50* (2011.01)
*H01R 12/70* (2011.01)
(Continued)

(52) U.S. Cl.
CPC ......... *H01R 24/50* (2013.01); *H01R 12/7047* (2013.01); *H05K 1/119* (2013.01);
(Continued)

(58) Field of Classification Search
CPC .... H01R 24/50; H01R 12/55; H01R 2103/00; H01R 12/7047; H05K 1/119; H05K 2201/09163
See application file for complete search history.

(56) References Cited

U.S. PATENT DOCUMENTS

| 7,500,855 B2 * | 3/2009 | Kari ..................... | H01R 24/50 439/63 |
| 7,980,893 B2 * | 7/2011 | Sato ..................... | H01R 24/50 439/63 |
| 2005/0245110 A1 * | 11/2005 | Kerekes ............... | H01R 12/721 439/79 |

FOREIGN PATENT DOCUMENTS

| JP | 2007-141606 A | 6/2007 |
| JP | 2008-171801 A | 7/2008 |
| JP | 2019-029103 A | 2/2019 |

OTHER PUBLICATIONS

Office Action from corresponding Korean Patent Application No. 10-2020-0024374, dated Jul. 14, 2021.

* cited by examiner

*Primary Examiner* — Briggitte R. Hammond
(74) *Attorney, Agent, or Firm* — Harness, Dickey & Pierce, P.L.C.

(57) ABSTRACT

A connector assembly includes a first signal pin formed to be in contact with a signal line of a circuit board; a first insulator surrounding the first signal pin; and a first housing accommodating the first signal pin and the first insulator and having a hole at a rear thereof corresponding to the first signal pin, wherein the first housing includes at least one clamping arm disposed on at least one side of the hole, protruding to a rear of the first housing, and having a lower surface formed to be in contact with an upper surface of the circuit board and the connector assembly further includes a ground plate disposed below the clamping arm and having an upper surface formed to be in contact with a lower surface of the circuit board; a clamping plate movably disposed below the ground plate; and a fastening member.

8 Claims, 21 Drawing Sheets

(51) Int. Cl.
    *H01R 103/00*     (2006.01)
    *H05K 1/11*     (2006.01)
    *H01R 12/55*     (2011.01)

(52) U.S. Cl.
    CPC .......... *H01R 12/55* (2013.01); *H01R 2103/00* (2013.01); *H05K 2201/09163* (2013.01)

CONNECTOR ASSEMBLY COUPLED TO A SIDE OF CIRCUIT BOARD

CROSS-REFERENCE TO RELATED APPLICATION

This application claims the benefit under 35 USC § 119(a) of Korean Patent Application No. 10-2020-0024374, filed on Feb. 27, 2020, in the Korean Intellectual Property Office, the entire disclosure of which is incorporated herein by reference for all purposes.

FIELD

The following description relates to a connector, and more particularly, to a connector assembly coupled to a side of a circuit board.

BACKGROUND

In general, internal circuits of wired/wireless communication devices are provided on circuit boards. To test circuits on a circuit board or to connect the circuit board to another device, a connector having one side coupled to a side of the circuit board and the other side coupled to a coaxial cable or coaxial connector is used.

However, conventional connectors have difficulty with electrical connection (e.g., soldering, and the like) between a signal pin of the connector and a signal line of a circuit board due to a fastening structure for coupling with a side of the circuit board. In addition, the conventional connectors suffer from a drawback in that workability is significantly deteriorated by the complicated work of coupling the connector in place on the side of the circuit board.

Further, although various standards pertaining to coaxial cables or coaxial connectors exist, the existing connectors are compatible only with coaxial cables or coaxial connectors of specific standards, so when coaxial cables or coaxial connectors of other standards are intended to be used, there is an inconvenience of having to replace a connector for each standard to be used.

SUMMARY

This summary is provided to introduce a selection of concepts in a simplified form that are further described below in the Detailed Description. This summary is not intended to identify key features or essential features of the claimed subject matter, nor is it intended to be used as an aid in determining the scope of the claimed subject matter.

One object to be achieved by the present invention is to provide a connector assembly that is coupled to a side of a circuit board, which facilitates electrical connection between a signal pin of a connector and a signal line of the circuit board.

In addition, another object to be achieved by the present invention is to provide a connector assembly that is easily coupled to a side of a circuit board.

Further, still another object to be achieved by the present invention is to provide a connector assembly compatible with coaxial cables or coaxial connectors of various standards.

The objects to be achieved by the present invention are not limited to the foregoing objects, and additional objects, which are not mentioned herein, will be readily understood by those skilled in the art from the following description.

A connector assembly according to the present invention includes: a first signal pin formed to be in contact with a signal line of a circuit board; a first insulator surrounding the first signal pin; and a first housing accommodating the first signal pin and the first insulator and having a hole at a rear thereof corresponding to the first signal pin, wherein the first housing includes at least one clamping arm disposed on at least one side of the hole, protruding to a rear of the first housing, and having a lower surface formed to be in contact with an upper surface of the circuit board and the connector assembly further includes a ground plate disposed below the clamping arm and having an upper surface formed to be in contact with a lower surface of the circuit board; a clamping plate movably disposed below the ground plate; and a fastening member configured to clamp the clamping plate and the clamping arm with the ground plate interposed therebetween.

The first housing may have an upper surface and a rear surface extending downward from the upper surface, and the clamping arm may be a predetermined distance below the upper surface and protrude rearward from the rear surface.

The connector assembly may further include an elastic member disposed below the clamping arm and across the ground plate and the clamping plate and disposed to push the ground plate and the clamping plate in opposite directions with a restoring force.

The clamping arm may include a first clamping arm and a second clamping arm respectively disposed on both sides of the hole, the fastening member may include a first fastening member and a second fastening member that respectively clamp the first clamping arm and the second clamping arm and the clamping plate, and the elastic member may include a first elastic member and a second elastic member respectively disposed below the first clamping arm and the second clamping arm.

The ground plate may include a first hole and a second hole through which the first fastening member and the second fastening member respectively pass, and a first groove and a second groove that are opened downward at positions corresponding to the first hole and the second hole, respectively, the clamping plate may include a third hole and a fourth hole through which the first fastening member and the second fastening member respectively pass, and a third groove and a fourth groove that are opened upward at positions corresponding to the third hole and the fourth hole, respectively, the first elastic member may be disposed across the first groove and the third groove, and the second elastic member may be disposed across the second groove and the fourth groove.

The first elastic member may push an inner upper surface of the first groove and an inner lower surface of the third groove in opposite directions, and the second elastic member may push an inner upper surface of the second groove and an inner lower surface of the fourth groove in opposite directions.

The first signal pin may have a rear end in contact with the signal line of the circuit board, and the connector assembly may further include a second signal pin coupled to a front end of the first signal pin; a second housing accommodating the second signal pin and having a hole at a rear thereof corresponding to the second signal pin; and a coupling member configured to couple the first housing and the second housing.

The first signal pin, the first insulator, the first housing, the clamping arm, the ground plate, and the clamping plate may constitute a first connector part, the second signal pin and the second housing may constitute a second connector part, and a different second connector part may be coupled to the first connector part.

Other features and aspects will be apparent from the following detailed description, the drawings, and the claims.

Figure 1A:
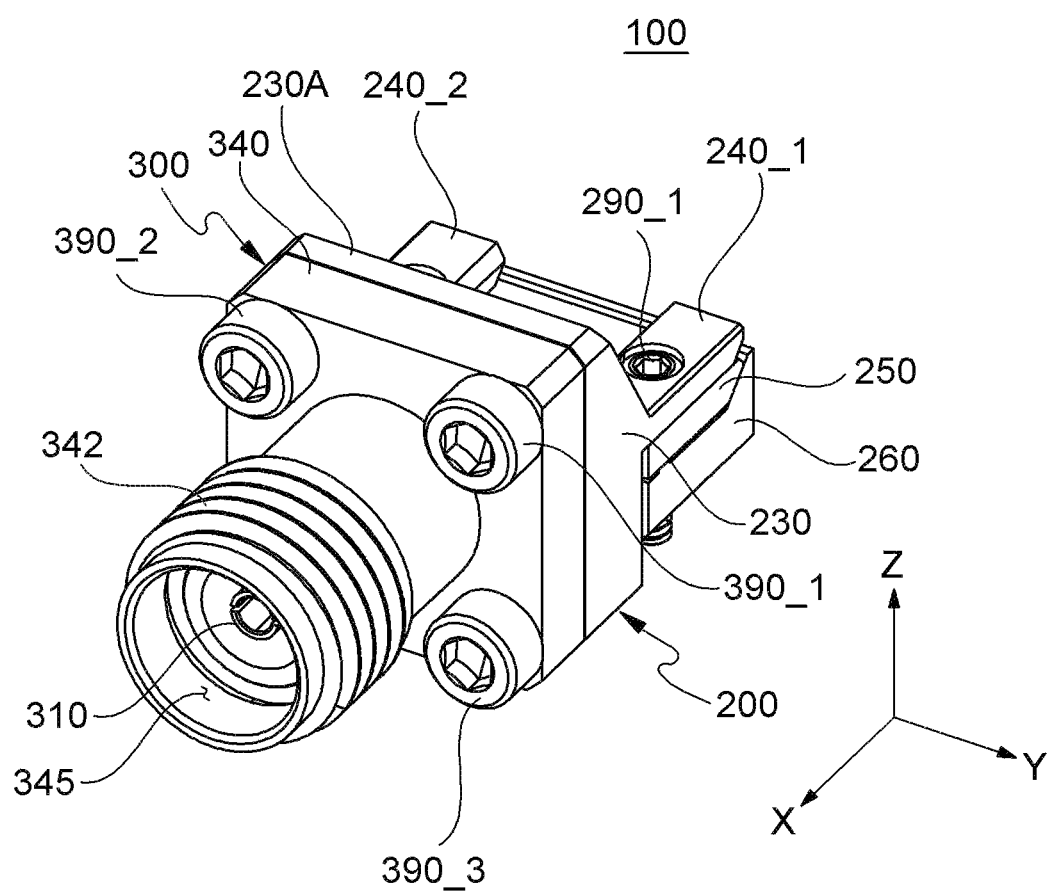
FIG. 1A is a perspective view of one side of a connector assembly according to an embodiment of the present invention.

Throughout the drawings and the detailed description, unless otherwise described, the same drawing reference numerals will be understood to refer to the same elements, features, and structures. The relative size and depiction of these elements may be exaggerated for clarity, illustration, and convenience.

DETAILED DESCRIPTION

Hereinafter, embodiments of the present invention will be described in detail with reference to the drawings so that those of ordinary skill in the art may easily implement the present invention. In the present specification, reference now should be made to the drawings, in which the same reference numerals are used throughout the different drawings to designate the same or similar components. Further, in the description of the present invention, if detailed descriptions of related well-known constructions or functions are determined to make the gist of the present invention unclear, the detailed descriptions will be omitted.

FIGS. 1A to 4B are views of a connector assembly 100 according to an embodiment of the present invention. In this specification, for convenience of description, with respect to FIGS. 1A and 1B, the positive X-axis direction is defined as a forward direction (or a front side or a front end) and the negative X-axis direction is a rearward direction (or a rear side or a rear end). The positive Z-axis direction is defined as an upper direction (or an upper surface or an upper end) and the negative Z-axis direction is a lower direction (or a lower surface or a lower end). The positive and negative Y-axis directions are defined as a lateral direction.

Figure 1B:
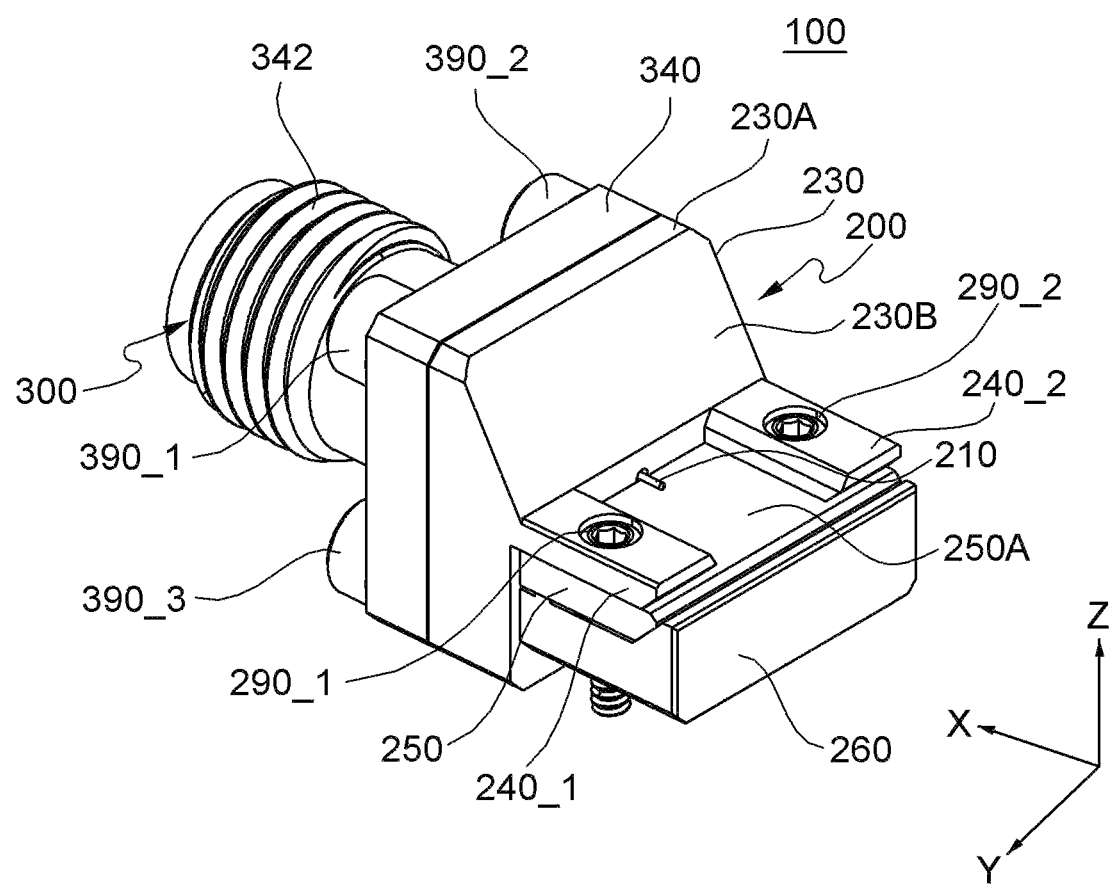
FIG. 1B is a perspective view of another side of the connector assembly according to an embodiment of the present invention.
Figure 1C:
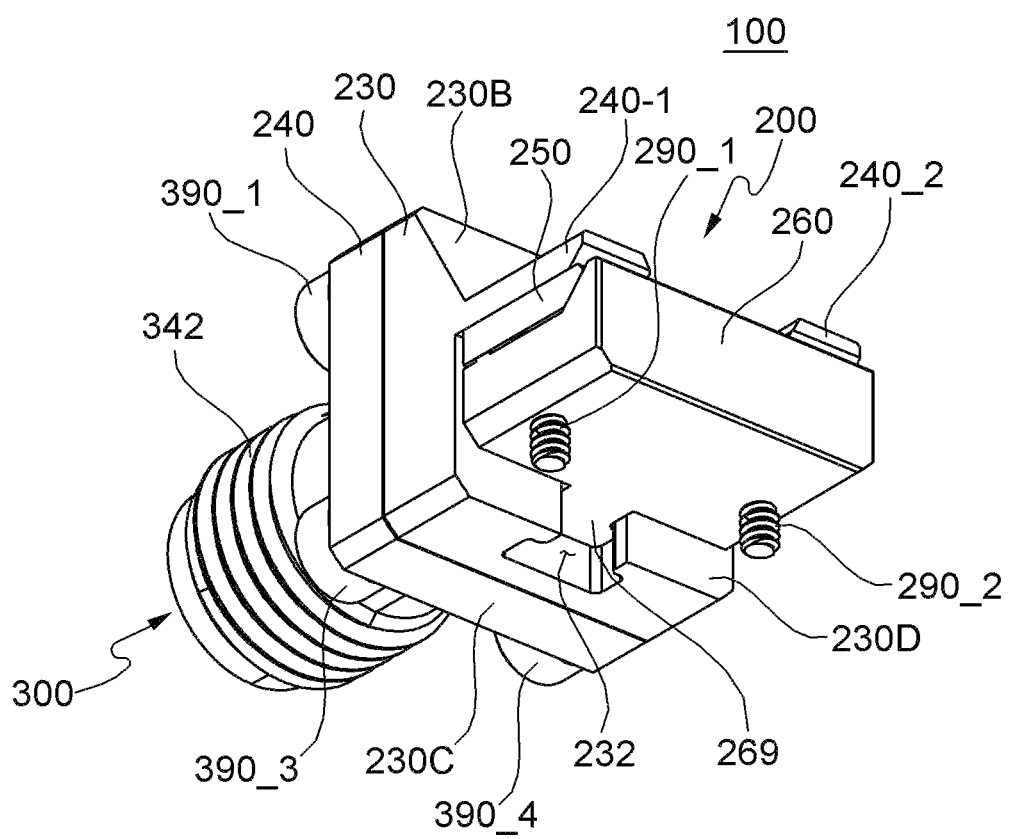
FIG. 1C is a perspective view of still another side of the connector assembly according to an embodiment of the present invention.

FIG. 1A is a perspective view of the connector assembly 100 as viewed from the upper front side thereof, FIG. 1B is a perspective view of the connector assembly 100 as viewed from the upper rear side thereof, and FIG. 1C is a perspective view of the connector assembly 100 as viewed from the lower rear side thereof.

The connector assembly 100 according to the present embodiment is generally composed of a first connector part 200 and a second connector part 300. The first connector part 200 may be coupled to a side of a circuit board in the rear of the first connector part 200, and the second connector part 300 may be coupled to a coaxial cable (or a coaxial connector, hereinafter a "coaxial cable" may be interchanged with a "coaxial connector") in the front of the second connector part 300.

Figure 2A:
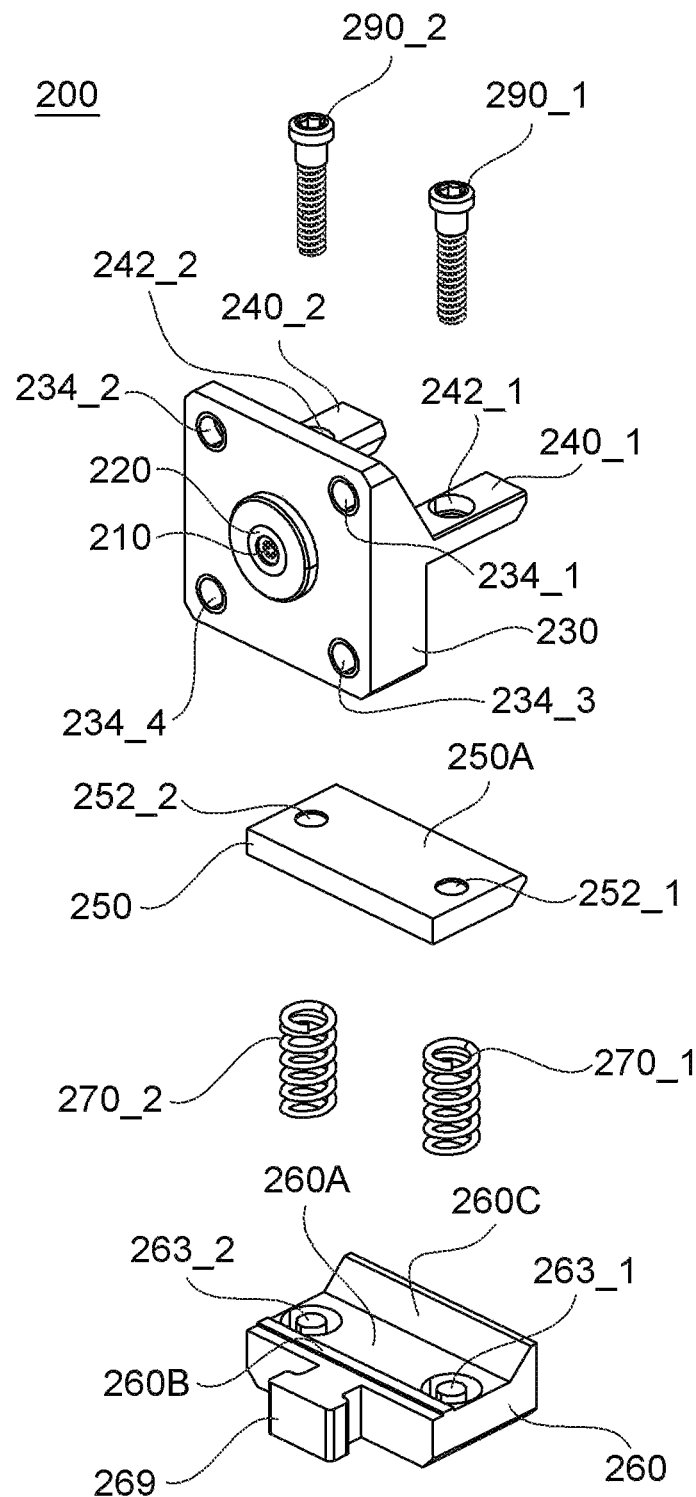
FIG. 2A is an exploded perspective view of one side of a first connector part of the connector assembly according to an embodiment of the present invention.
Figure 2B:
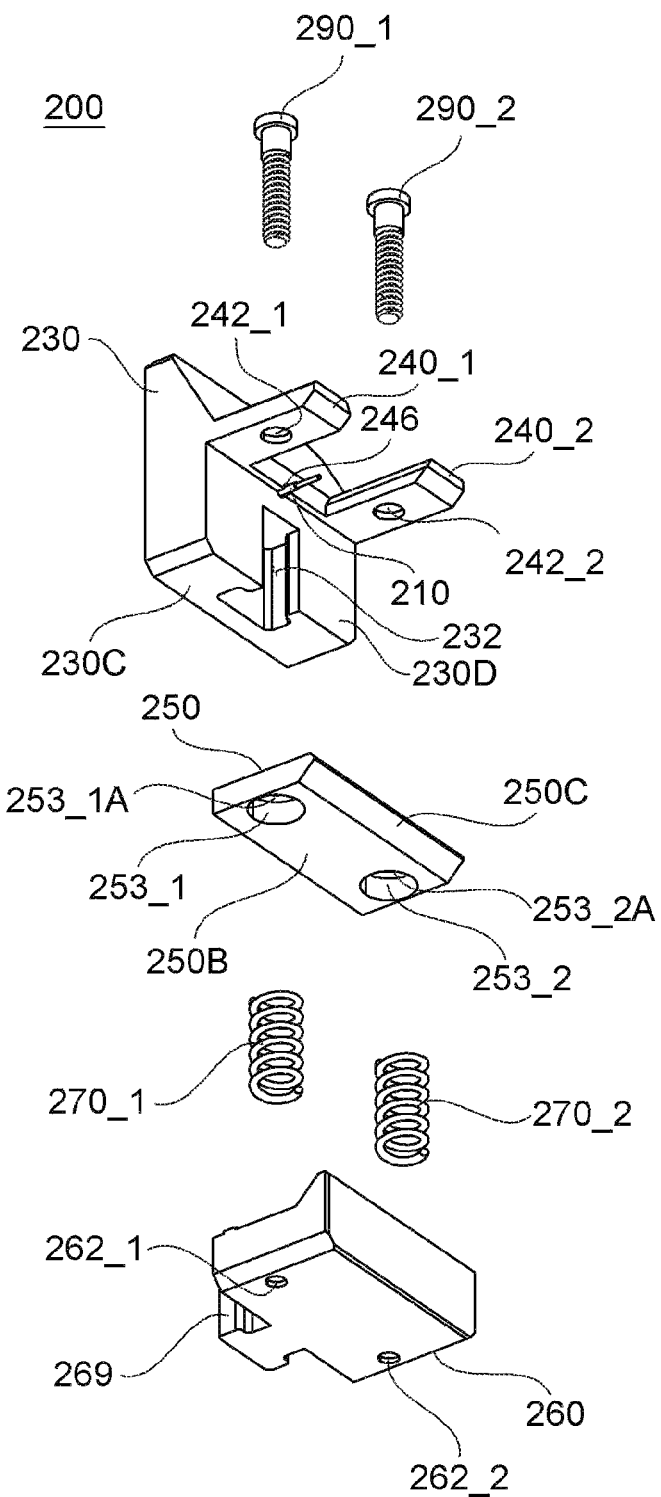
FIG. 2B is an exploded perspective view of another side of the first connector part of the connector assembly according to an embodiment of the present invention.

FIG. 2A is an exploded perspective view of the first connector part 200 as viewed from the upper front side thereof, and FIG. 2B is an exploded perspective view of the first connector portion 200 as viewed from the rear lower side thereof.

The first connector part 200 includes a first signal pin 210, a first insulator 220, a first housing 230, a first clamping arm 240_1, a second clamping arm 240_2, a ground plate 250, a clamping plate 260, a first fastening member 290_1, a second fastening member 290_2, a first elastic member 270_1, and a second elastic member 270_2.

Figure 3A:
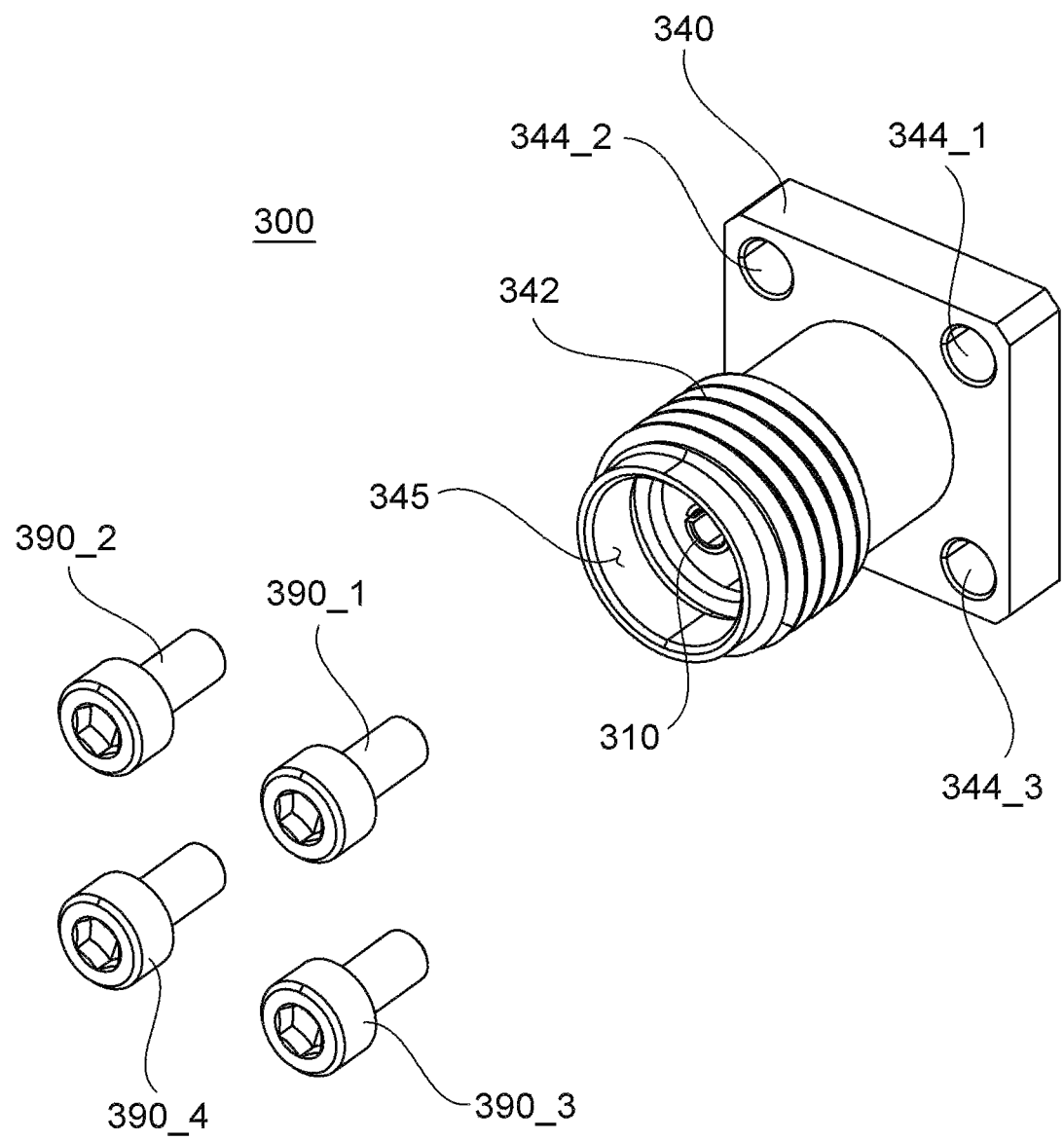
FIG. 3A is an exploded perspective view of one side of a second connector part of the connector assembly according to an embodiment of the present invention.
Figure 3B:
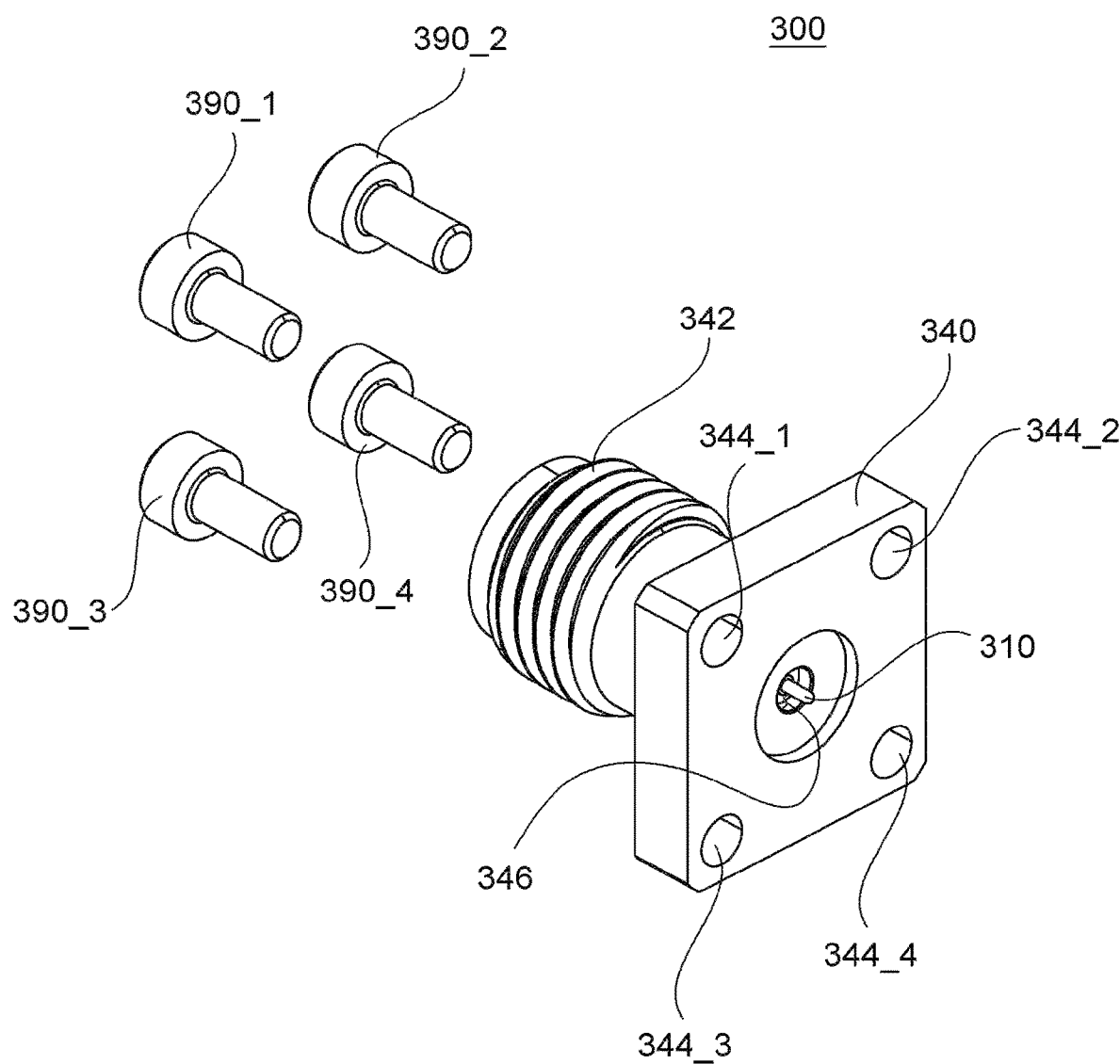
FIG. 3B is an exploded perspective view of another side of the second connector part of the connector assembly according to an embodiment of the present invention.

FIG. 3A is an exploded perspective view of the second connector part 300 as viewed from the upper front side thereof, and FIG. 3B is an exploded perspective view of the second connector part 300 as viewed from the upper rear side thereof.

The second connector part 300 includes a second signal pin 310, a second insulator (not shown), a second housing 340, a first coupling member 390_1, a second coupling member 390_2, a third coupling member 390_3, and a fourth coupling member 390_4.

Figure 4A:
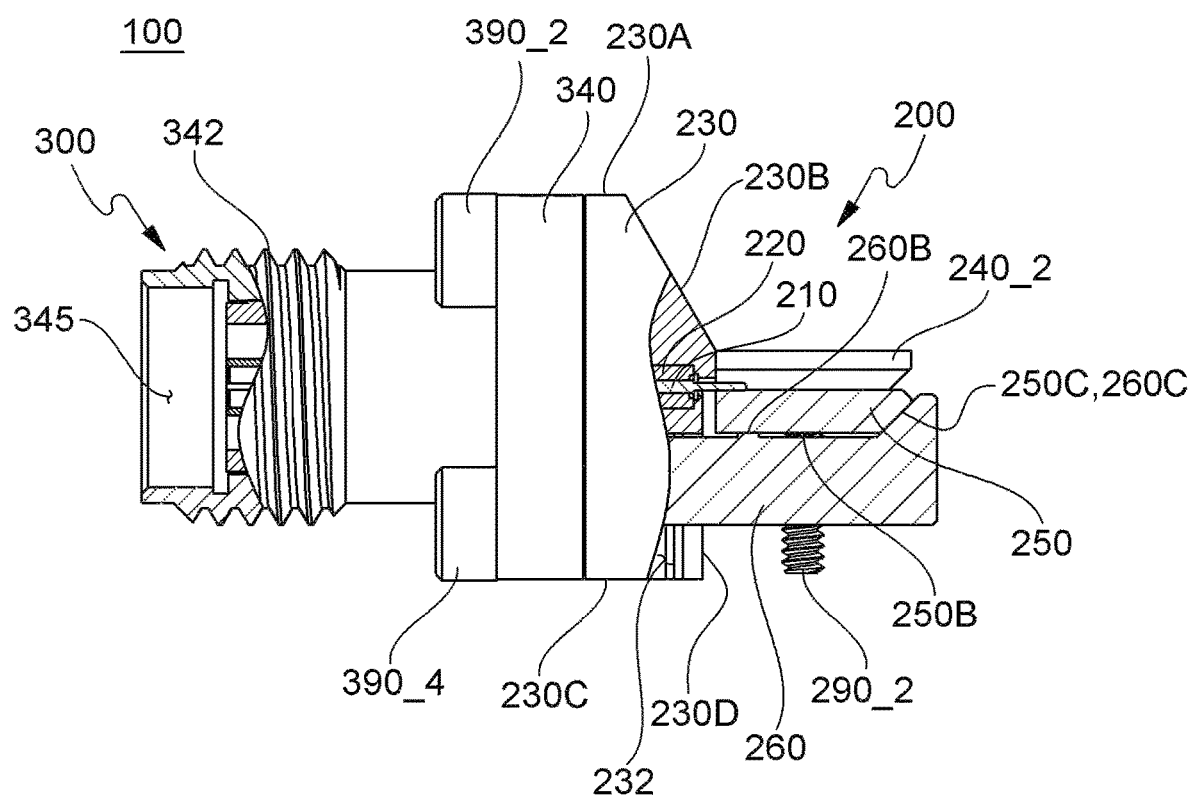
FIG. 4A is a side cross-sectional view of one side of the connector assembly according to an embodiment of the present invention.
Figure 4B:
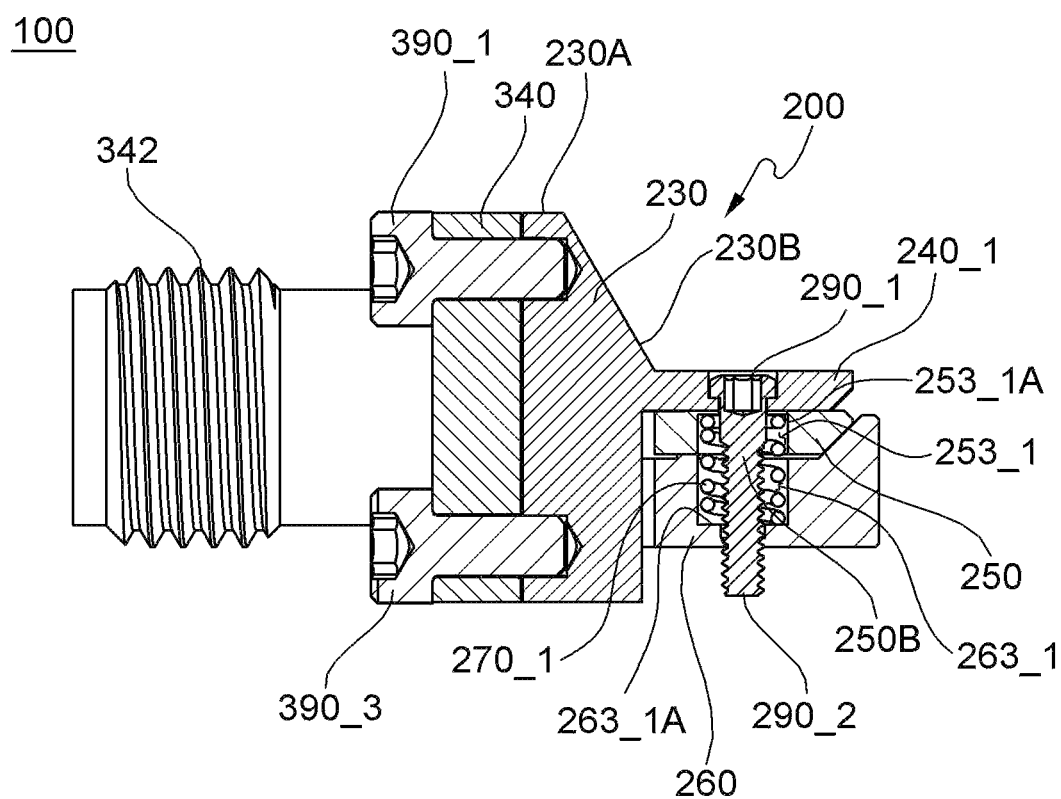
FIG. 4B is a cross-sectional view of another side of the connector assembly according to an embodiment of the present invention.

FIG. 4A is a side cross-sectional view across the first signal pin 210 of the connector assembly 100, and FIG. 4B is a side cross-sectional view cross the first fastening member 290_1 of the connector assembly 100. The connector assembly 100 has a structure in which both sides are symmetric, and a side cross-sectional view across the second fastening member 290_2 is substantially the same as shown in FIG. 4B.

Figure 5A:
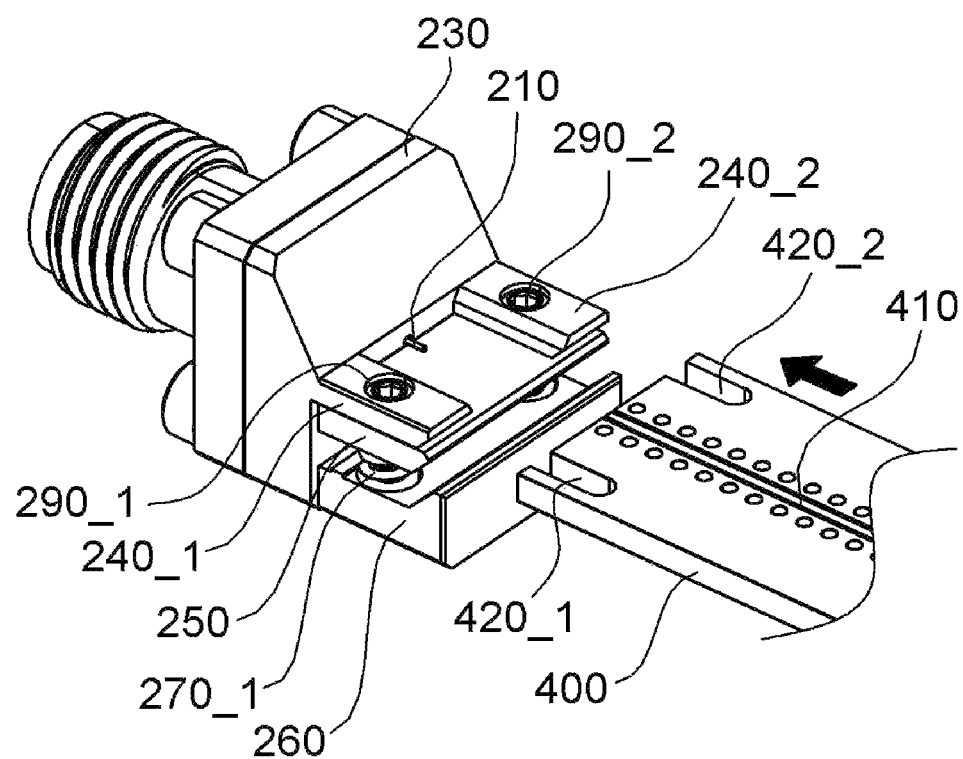
FIG. 5A shows a state in which a connector assembly and a circuit board are aligned before the connector assembly is coupled to the circuit board.

Referring to FIG. 5A, a circuit board 400 to which the connector assembly 100 is coupled has a signal line on an upper surface thereof extending in a direction substantially vertical to the side surface, and a first groove 420_1 and a second groove 420_2 formed at positions corresponding to the first and second elastic members 270_1 and 270_2, respectively, each groove extending inwardly by a predetermined length from the side surface and having a through-opening extending from a top surface to a bottom surface. A ground may be formed on a lower surface of the circuit board 400.

The rear end of the first signal pin 210 is formed to be relatively thin so as to be in contact with the signal line 410 of the circuit board 400, and an insertion slot is formed at a front end of the first signal pin 210 so that a rear end of the second signal pin 310 is inserted and coupled thereto.

The first insulator 220 is formed in the shape of a hollow body, surrounding the first signal pin 210, and serves to insulate the first signal pin 210 from the first housing 230.

The first housing 230 accommodates the first signal pin 210 and the first insulator 220, and a hole 246 is formed on the rear surface thereof so that the first signal pin 210 protrudes rearward.

The first housing 230 has an upper surface 230A and a first rear surface 230B extending downward from the upper surface 230A. The first rear surface 230B may extend obliquely downward from the upper surface 230A as shown in the drawings.

The first housing 230 are provided with the first and second clamping arms 240_1 and 240_2 to clamp the circuit board 400. The first and second clamping arms 240_1 and 240_2 may be disposed on both sides of the hole 246, that is, on both sides of the first signal pin 210. The first and second clamping arms 240_1 and 240_2 may be a predetermined distance below the upper surface 230A of the first housing 230 and protrude rearward from the first rear surface 230B. When the first connector part 200 is coupled to the circuit board 400, the lower surfaces of the first and second clamping arms 240_1 and 240_2 are in contact with the upper surfaces of the circuit board 400.

The ground plate 250 is disposed below the first and second clamping arms 240-1 and 240-2. When the first connector part 200 is coupled to the circuit board 400, an upper surface of the ground plate 250 is in contact with the lower surface of the circuit board 400. In other words, when the first connector part 200 is coupled to the circuit board 400, the circuit board 400 is clamped while being interposed between the first and second clamping arms 240_1 and 240_2 and the ground plate 250.

The clamping plate 260 is disposed below the ground plate 250 so as to be movable in a vertical direction. The first housing 230 may include a lower surface 230C and a guide slot 232 formed along a vertical direction across a second rear surface 230D that extends upward from the lower rear surface 230C. Correspondingly, the clamping plate 260 may include a guide protrusion portion 269 formed to move in a vertical direction along the guide slot 232. With the help of the guide slot 232 and the guide protrusion portion 269, the clamping plate 260 can move in a vertical direction along the second rear surface 230D of the first housing 230.

The first fastening member 290_1 clamps the clamping plate 260 and the first clamping arm 240_1 with the ground plate 250 interposed therebetween (when coupled to the circuit board 400, the circuit board 400 and the ground plate 250 are interposed). The second fastening member 290_2 also clamps the clamping plate 260 and the second clamping arm 240_2 with the ground plate 250 interposed therebetween. In the present embodiment, a bolt is exemplified as the fastening member, but other types of fastening means other than the bolt may be employed.

Holes 242_1, 252_1, and 262_1 may be formed in the first clamping arm 240_1, the ground plate 250, and the clamping plate 260, respectively, so that the first fastening member 290_1 may pass therethrough. Holes 242_2, 252_2, and 262_2 may be formed in the second clamping arm 240_2, the ground plate 250, and the clamping plate 260, respectively, so that the second fastening member 290_2 may pass therethrough. In the holes 262_1 and 262_2 of the clamping plate 260, internal threads may be formed corresponding to external threads of the first and second fastening members 290_1 and 290_2, so that the clamping plate 260 can be vertically moved by the first and second fastening members 290_1 and 290_2 and be clamped by the first and second fastening members 290_1 and 290_2 together with the first and second clamping arms 240_1 and 240_2.

The ground plate 250 may have an inclined surface 250C extending obliquely upward from the rear end of the lower surface 250B. Corresponding to the inclined surface 250C, the clamping plate 260 may have an inclined surface 260C extending obliquely upward from the rear end of the upper surface 260A. In addition, the clamping plate 260 may have a protruding surface 260B protruding from the upper surface 260A. Thus, the lower surface 250B of the ground plate 250 and the protruding surface 260B of the clamping plate 260 may be in close contact, and the inclined surface 250C of the ground plate 250 and the inclined surface 260C of the clamping plate 260 may be in close contact.

Meanwhile, in the connector assembly 100 according to an embodiment of the present invention, the first and second elastic members 270_1 and 270_2 are included to facilitate a temporary insertion of the circuit board 400 between the first and second clamping arms 240_1 and 240_2 and the ground plate 250 in the process of coupling the connector assembly 100 and the circuit board 400. In the present embodiment, a spring is exemplified as the elastic member, but other types of elastic members other than the spring may be employed.

The first elastic member 270_1 is disposed below the first clamping arm 240_1 to extend and retract in a vertical direction across the ground plate 250 and the clamping plate 260. The first elastic member 270_1 may push the ground plate 250 and the clamping plate 260 in opposite directions with a restoring force which tends to extend the first elastic member 270_1.

The second elastic member 270_2 is disposed below the second clamping arm 240_2 to extend and retract in a vertical direction across the ground plate 250 and the clamping plate 260. The second elastic member 270_2 may push the ground plate 250 and the clamping plate 260 in opposite directions with a restoring force which tends to extend the second elastic member 270_2.

The ground plate 250 may have a groove 253_1 opened downward at a position corresponding to the hole 252_1, and the clamping plate 260 may have a groove 263_1 opened upward at a position corresponding to the hole 262_1. The first elastic member 270_1 may be disposed across the groove 253_1 of the ground plate 250 and the groove 263_1 of the clamping plate 260 while surrounding the first fastening member 290_1, an upper end thereof may be in contact with an inner upper surface 253_1A of the groove 253_1, and a lower end thereof may be in contact with an inner lower surface 263_1A of the groove 263_1. The first elastic member 270_1 may push the inner upper surface 253_1A of the groove 253_1 and the inner lower surface 263_1A of the groove 263_1 in opposite directions, thereby pushing the ground plate 250 and the clamping plate 260 in opposite directions to each other.

The ground plate 250 may have a groove 253_2 opened downward at a position corresponding to the hole 252_2, and the clamping plate 260 may have a groove 263_2 opened upward at a position corresponding to the hole 262_2. The second elastic member 270_2 may be disposed across the groove 253_2 of the ground plate 250 and the groove 263_2 of the clamping plate 260 while surrounding the second fastening member 290_2, an upper end thereof may be in contact with an inner upper surface 253_2A of the groove 253_2, and a lower end thereof may be in contact with an inner lower surface 263_2A of the groove 263_2. The second elastic member 270_2 may push the inner upper surface 253_2A of the groove 253_2 and the inner lower surface 263_2A of the groove 263_2 in opposite directions, thereby pushing the ground plate 250 and the clamping plate 260 in opposite directions to each other.

When the circuit board 400 is inserted between the first and second clamping arms 240_1 and 240_2 and the ground plate 250 in the process of coupling the connector assembly 100 and the circuit board 400, the first elastic member 270_1 and the second elastic member 270_2 push the ground plate 250 and the clamping plate 260 in opposite directions to each other. By a force pushing the ground plate 250 upward, the circuit board 400 slides naturally by external force without causing a problem of shaking or being out of position between the first and second clamping arms 240_1 and 240_2 and the round plate 250, and thus the connector assembly 100 and the circuit board 400 are easily coupled. The coupling process of the connector assembly 100 and the circuit board 400 will be described in more detail below with reference to FIGS. 5A to 8C.

The second signal pin 310 is formed relatively thin so that the rear end thereof is inserted and coupled to the insertion slot of the first signal pin 210. An insertion slot is formed at the front end of the second signal pin 310 so that a signal pin (not shown) of the coaxial cable is inserted and coupled thereto.

The second insulator (not shown) has a hollow body shape, surrounding the second signal pin 310, and serves to insulate the second signal pin 310 from the second housing 340.

The second housing 340 accommodates the second signal pin 310 and the second insulator (not shown), and a hole 346 is formed on the rear surface thereof so that the second signal pin 310 protrudes rearward. The second housing 340 may include a fastening part 342 for coupling with a coaxial cable at the front side, and an opening 345 into which the coaxial cable is inserted may be formed in the fastening part 342.

The first to fourth coupling members 390_1, 390_2, 390_3, 390_4 couple the first housing 230 and the second housing 340. Holes 344_1, 344_2, 344_3, 344_4 through which the first to fourth coupling members 390_1, 390_2, 390_3, and 390_4 pass, respectively, may be formed in the second housing 340, and grooves 234_1, 234_2, 234_3, and 234_4 into which the first to fourth coupling members 390_1, 390_2, 390_3, and 390_4 are respectively inserted may be formed in the first housing 230.

In an embodiment of the present invention, the first connector part 200 coupled to the side of the circuit board and the second connector part 300 coupled to the coaxial cable are separately configured to be coupled to each other form the connector assembly 100. However, the first connector part 200 and the second connector part 300 may be integrally formed according to embodiments. For example, (apparently, specific shapes may vary), the first signal pin 210 and the second signal pin 310 may be integrally formed, the first insulator 220 and the second insulator (not shown) may be integrally formed, and the first housing 230 and the second housing 340 may be integrally formed. However, separately configuring the first connector part 200 and the second connector part 300 to be coupled to each other as in the embodiment of the present invention helps to provide a connector assembly compatible with coaxial cables of various standards. This will be described in more detail below with reference to FIGS. 10A to 10C.

FIG. 5A to 8C are diagrams illustrating a process of coupling the connector assembly 100 and the circuit board 400.

Figure 5B:
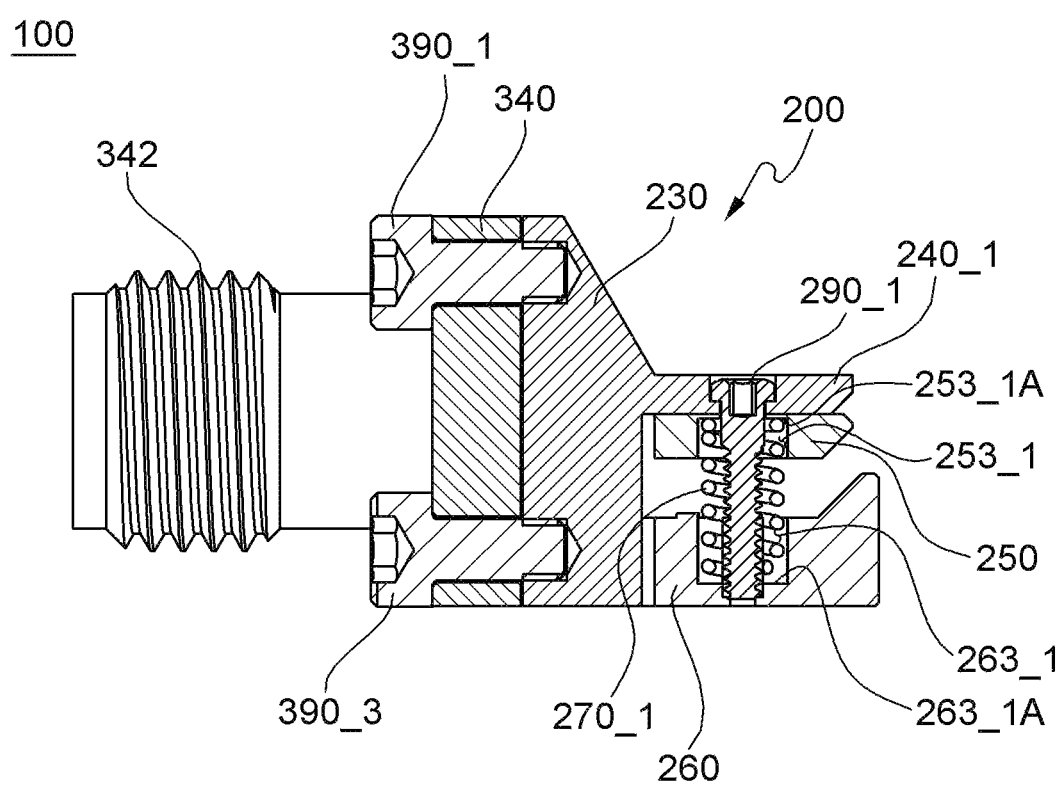
FIG. 5B is a side cross-sectional view of the connector assembly in the state shown in FIG. 5A.

FIG. 5A shows a state in which the connector assembly 100 and the circuit board 400 are aligned before the connector assembly 100 is coupled to the circuit board 400, and FIG. 5B is a side cross-sectional view crossing the first fastening member 290_1 of the connector assembly in the state shown in FIG. 5A.

As shown in the drawings, the first and second fastening members 290_1 and 290_2 are released from the connector assembly 100 so that the clamping plate 260 is sufficiently separated from the ground plate 250, and the circuit board 400 is disposed at the rear of the connector assembly 100 so that the signal line 410 is aligned with the first signal pin 210, the first and second grooves 420_1 and 420_2 are aligned with the first and second clamping arms 240_1 and 240_2, and the lower surface of the circuit board 400 is aligned with the upper surface of the ground plate 250.

The clamping plate 260 is fixed to the first and second fastening members 290_1 and 290_2, and the first and second elastic members 270_1 and 270_2 push the ground plate 250 upward, and thereby, the ground plate 250 is in a state in which the upper surface 250A thereof is in contact with the lower surfaces of the first and second clamping arms 240_1 and 240_2. In this state, when a force greater than the restoring force of the first and second elastic members 270_1 and 270_2 is applied downward to the ground plate 250, the ground plate 250 may elastically descend.

Figure 6A:
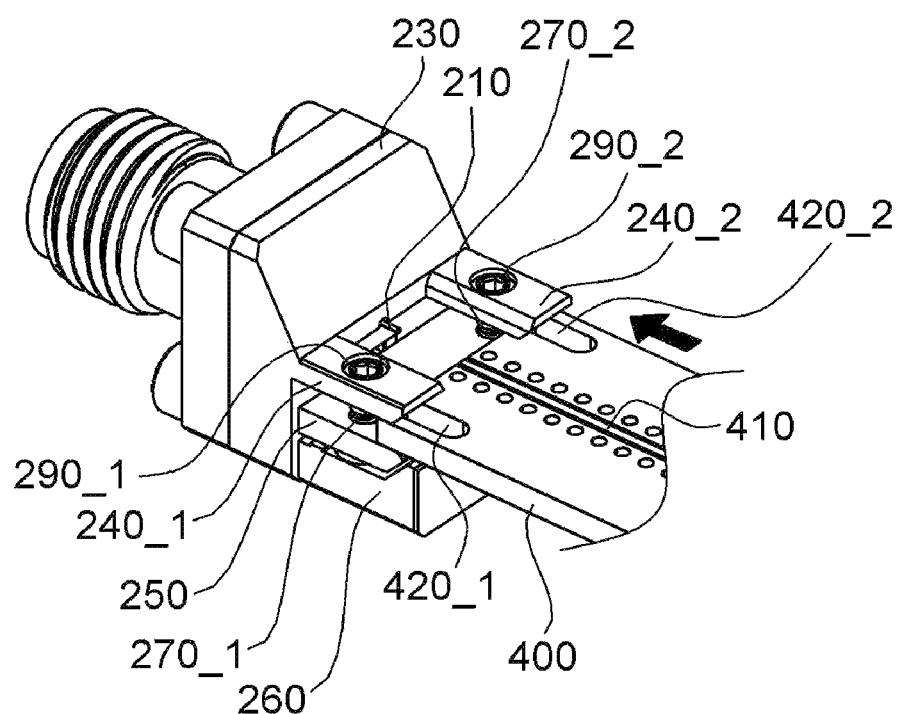
FIG. 6A shows a state in which a circuit board 400 is partially inserted between first and second clamping arms 240_1 and 240_2 and a ground plate 250.
Figure 6B:
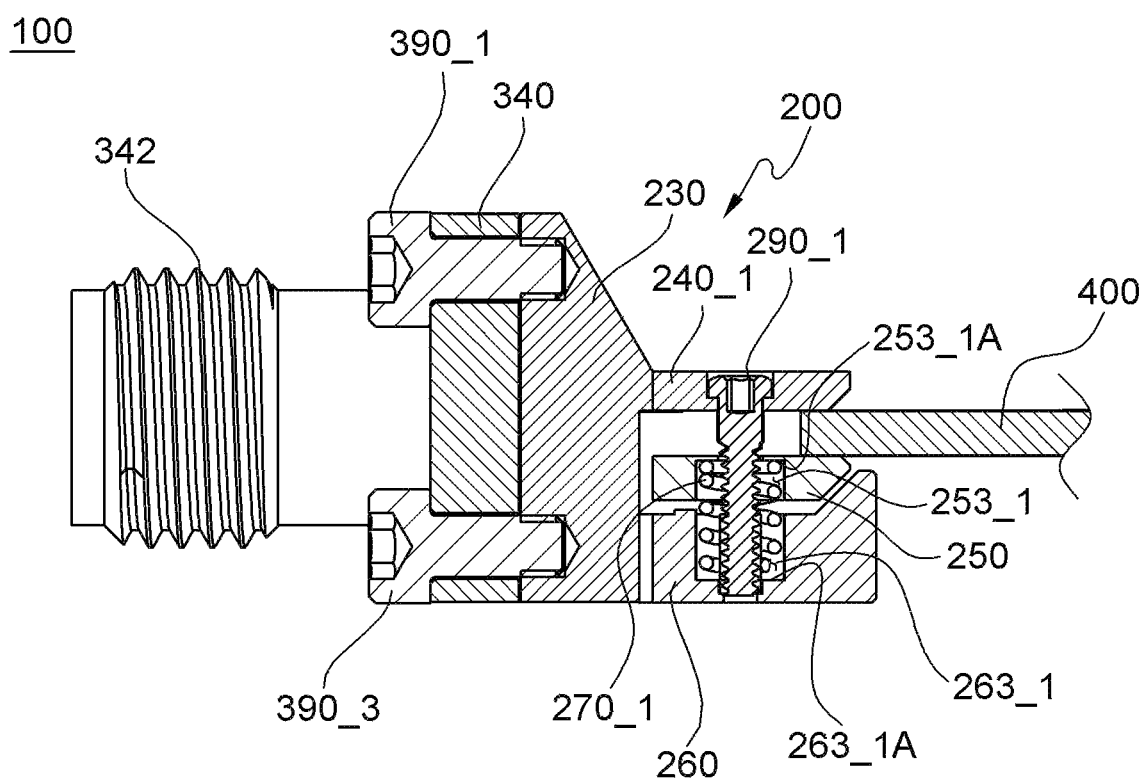
FIG. 6B is a cross-sectional view of the connector assembly in the state shown in FIG. 6A.

FIG. 6A shows a state in which the circuit board 400 is partially inserted between the first and second clamping arms 240_1 and 240_2 of the connector assembly 100 and the ground plate 250. FIG. 6B is a cross-sectional view crossing the first fastening member 290_1 of the connector assembly 100 in the state shown in FIG. 6A.

As shown in the drawings, when a force greater than the restoring force of the first and second elastic members 270_1 and 270_2 is applied downward to the ground plate 250 through the circuit board 400 while inserting the circuit board 400 between the first and second clamping arms 240_1 and 240_2 and the ground plate 250, the ground plate 250 elastically descends. Since the first and second elastic members 270_1 and 270_2 are still exerting an upward elastic force on the ground plate 250, the circuit board 400 may naturally slide by external force without causing a problem of shaking or being out of position between the first and second clamping arms 240_1 and 240_2 and the ground plate 250. In this case, the upper surface 250A of the ground plate 250 is in contact with the lower surface of the circuit board 400, while a gap exists between the ground plate 250 and the clamping plate 260.

Figure 7:
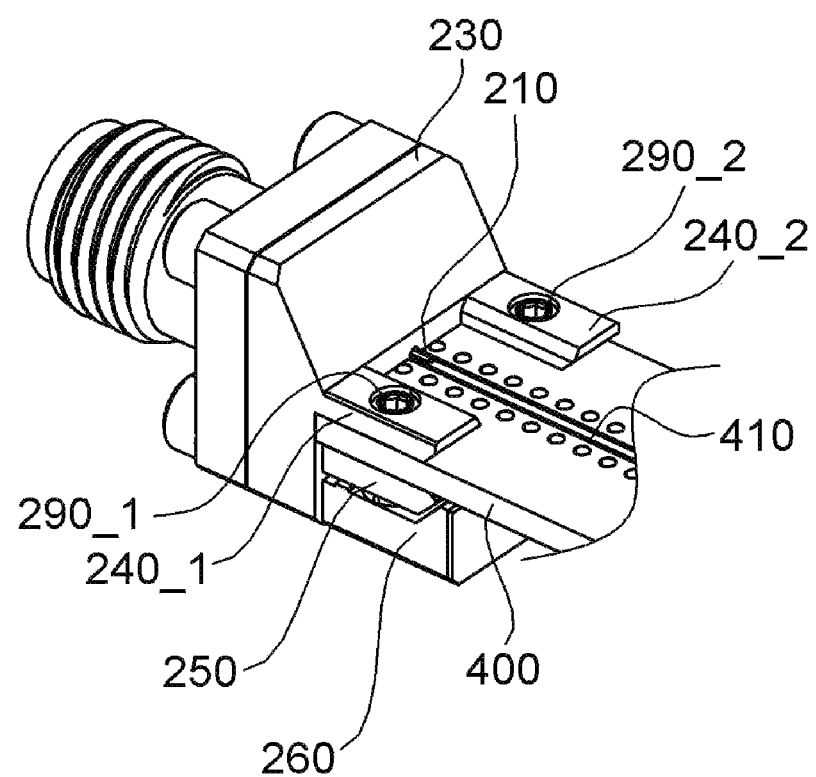
FIG. 7 shows a state in which the circuit board 400 is fully inserted between the first and second clamping arms 240_1 and 240_2 and the ground plate 250.

FIG. 7 shows a state in which the circuit board 400 is fully inserted between the first and second clamping arms 240_1 and 240_2 of the connector assembly 100 and the ground plate 250. In this state, the first signal pin 210 of the connector assembly 100 is in contact with the signal line 410 of the circuit board 400. In this case, the upper surface 250A of the ground plate 250 is also in contact with the lower surface of the circuit board 400, while a gap exists between the ground plate 250 and the clamping plate 260.

Since the first and second elastic members 270_1 and 270_2 are still exerting an upward elastic force on the ground plate 250, even if an operator does not hold the circuit board 400 firmly (or does not hold it at all), the circuit board 400 is not separated between the first and second clamping arms 240_1 and 240_2 and the ground plate 250. As such, the circuit board 400 may be "temporarily fixed" between the first and second clamping arms 240_1 and 240_2 and the ground plate 250.

Figure 8A:
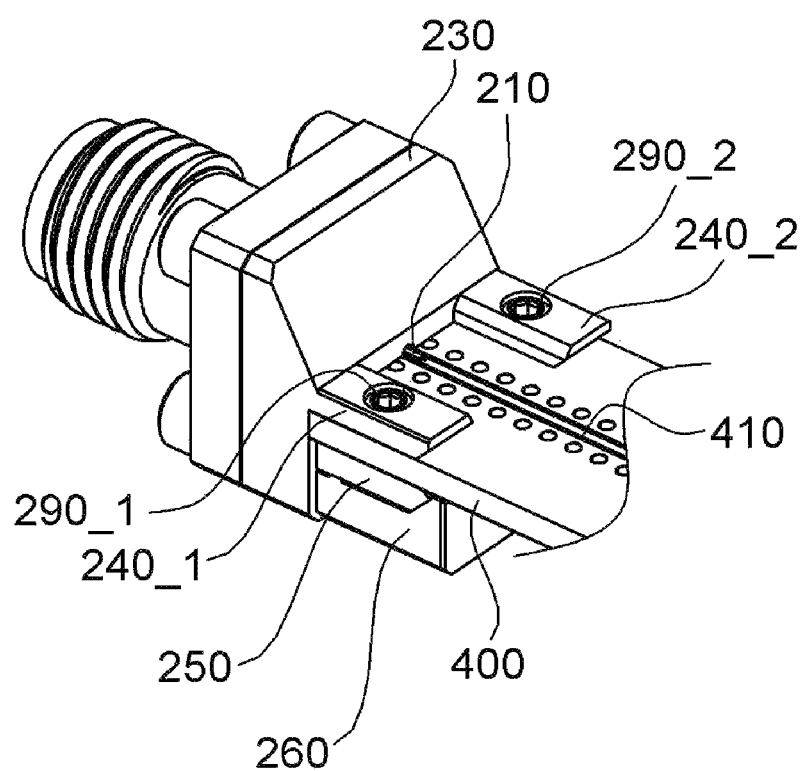
FIG. 8A shows a state in which the first and second clamping arms 240_1 and 240_2 and the clamping plate 260 are clamped with a clamping plate 260 while the circuit board 400 and the ground plate 250 are interposed therebetween.
Figure 8B:
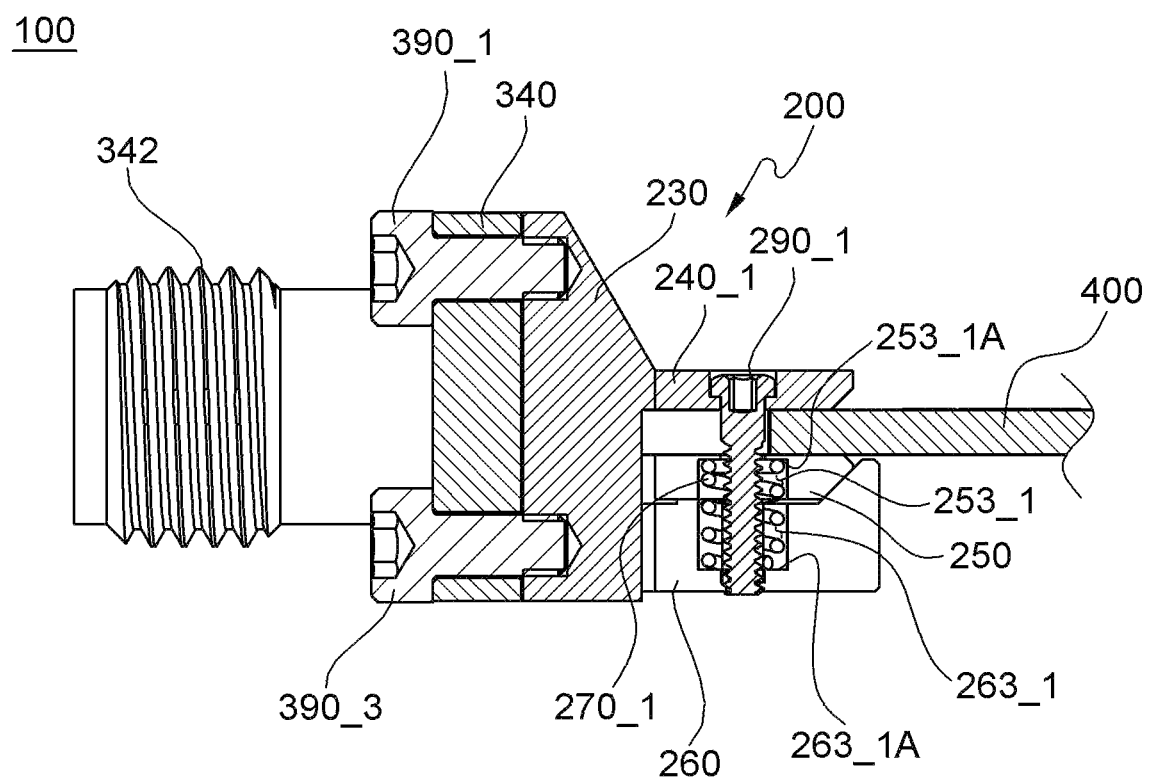
FIG. 8B is a cross-sectional view of one side of the connector assembly in the state shown in FIG. 8A.
Figure 8C:
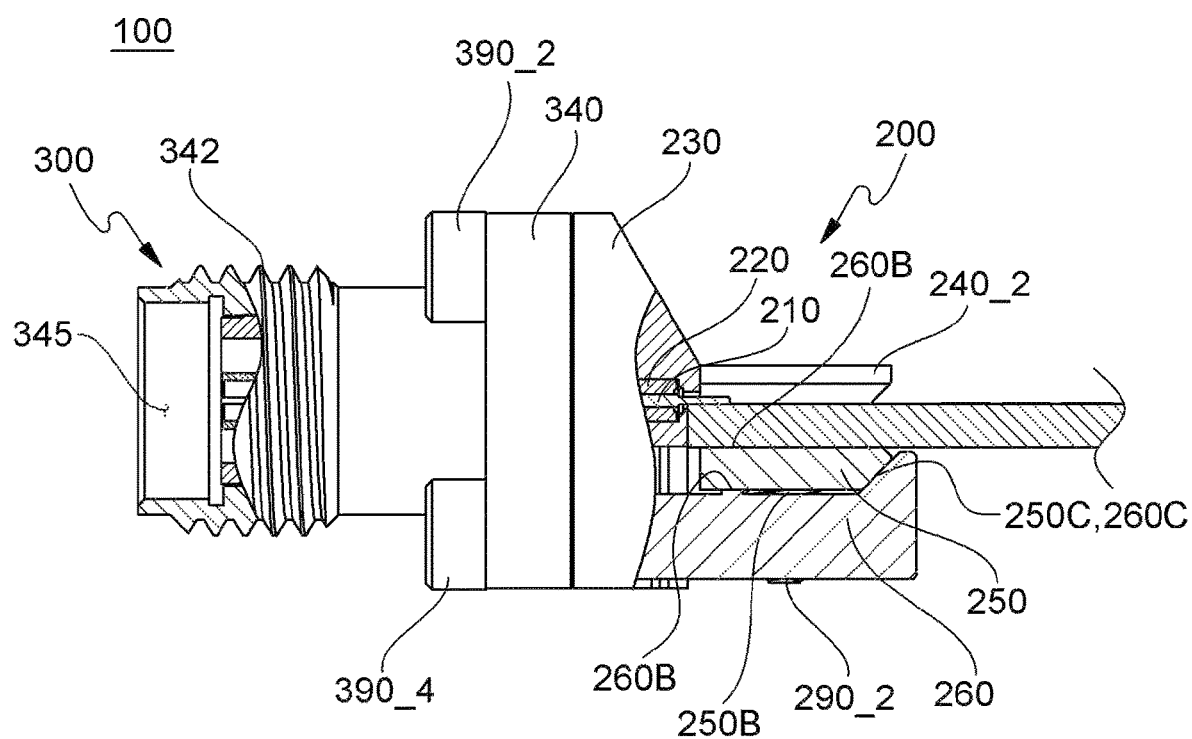
FIG. 8C is a cross-sectional view of another side of the connector assembly in the state shown in FIG. 8A.

As shown in FIG. 7, in a state in which the circuit board 400 is temporarily fixed between the first and second clamping arms 240_1 and 240_2 and the ground plate 250, when the first and second fastening members 290_1 and 290_2 are fastened, as shown in FIG. 8A, the first and second clamping arms 240_1 and 240_2 and the clamping plate 260 are clamped to each other with the circuit board 400 and the ground plate 250 interposed therebetween. FIG. 8B is a cross-sectional side view crossing the first fastening member 290_1 of the connector assembly 100 in the state shown in FIG. 8A, and FIG. 8C is side cross-sectional view crossing the first signal pin 210 and the second signal pin 310 of the connector assembly 100 in the state shown in FIG. 8A. In the state of FIG. 8A, the circuit board 400 is completely fixed between the first and second clamping arms 240_1 and 240_2 and the ground plate 250. In addition, the upper surface 250A of the ground plate 250 is in close contact with the lower surface of the circuit board 400, the lower surface 250B of the ground plate 250 is in close contact with the protruding surface 260B of the clamping plate 260, and the inclined surface 250C of the ground plate 250 is in close contact with the inclined surface 260C of the clamping plate 260.

Figure 9:
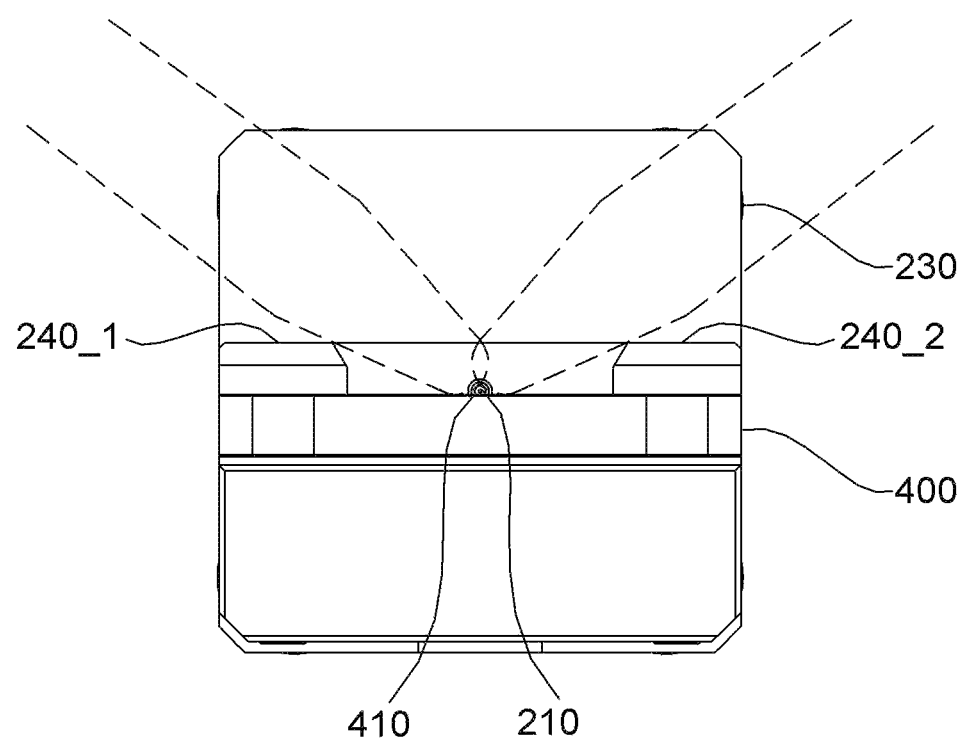
FIG. 9 shows an example of an operation of electrically connecting a first signal pin 210 of a connector assembly 100 and a signal line 410 of the circuit board 400.

FIG. 9 shows an example of electrically connecting the first signal pin 210 of the connector assembly 100 and the signal line 410 of the circuit board 400 in a state where the circuit board 400 is fixed between the first and second clamping arms 240_1 and 240_2 and the ground plate 250 as shown in FIG. 8A. The first signal pin 210 of the connector assembly 100 and the signal line 410 of the circuit board 400 may be electrically connected by, for example, soldering, and to this end, an iron may be used. According to an embodiment of the present invention, the first and second clamping arms 240_1 and 240_2 are positioned a predetermined distance below the upper surface 230A of the first housing 230, and thus the first and second clamping arms 240_1 and 240_2 and the first and second fastening members 290_1 and 290_2 rarely interfere with the operator when tilting the iron for soldering. For example, when two irons are used for soldering, a sufficient angle between the two irons needs to be provided. According to the present embodiment, approximately 90 or more degrees may be provided between the two irons as shown in FIG. 9.

Figure 10A:
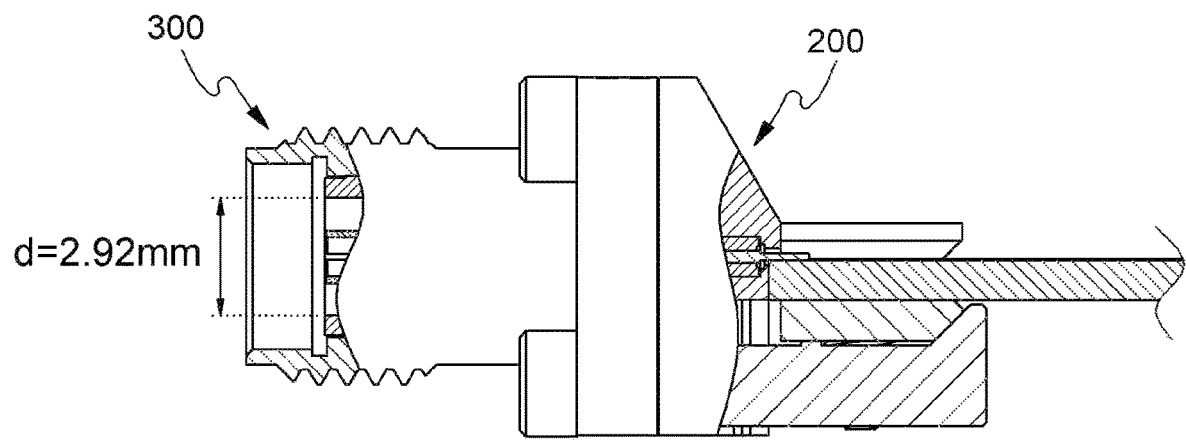
FIG. 10A is a cross-sectional view of a 2.92 mm connector assembly according to an embodiment of the present invention.
Figure 10B:
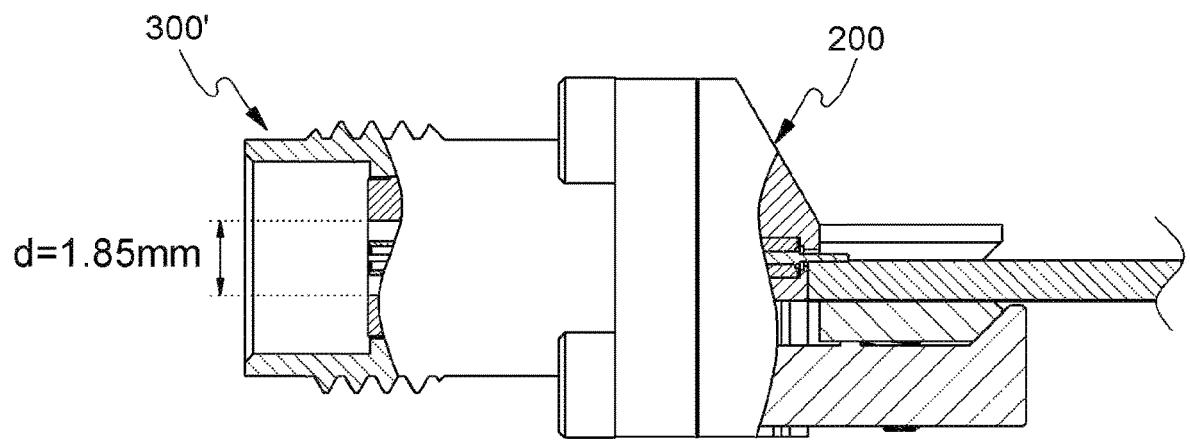
FIG. 10B is a cross-sectional view of a 1.85 mm connector assembly according to an embodiment of the present invention.
Figure 10C:
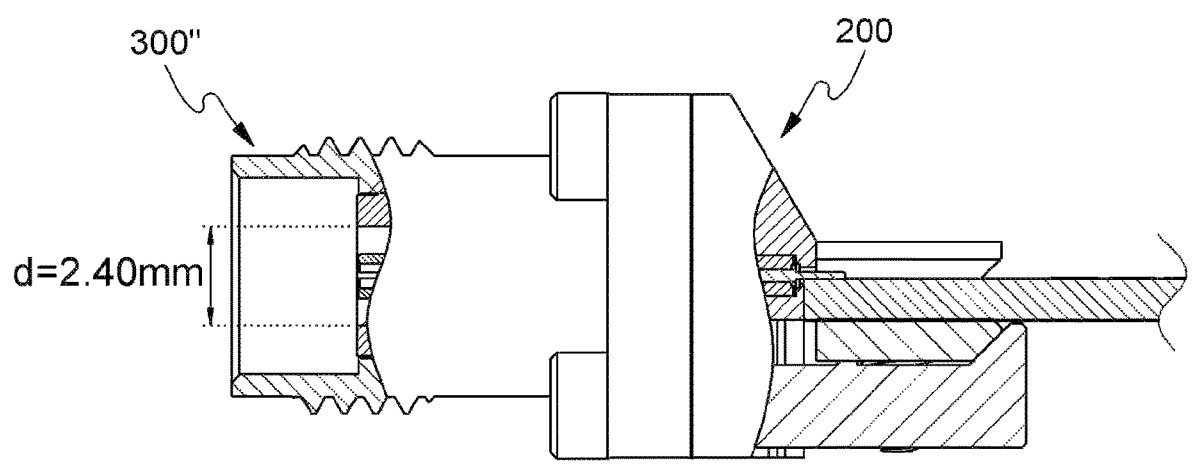
FIG. 10C is a cross-sectional view of a 2.40 mm connector assembly according to an embodiment of the present invention.

FIGS. 10A to 10C are views of connector assemblies of various sizes which are implemented according to an embodiment of the present invention. A size of a connector may be determined according to, for example, an inner diameter of a ground connection part. According to an embodiment of the present invention, the same first connector part 200 may be prepared regardless of a size of a coaxial cable, and second connector parts 200 having different inner diameters of the ground connection part to correspond to various sizes of coaxial cables may be provided, so that connector assemblies of various sizes may be provided by coupling the second connector parts 300 having different sizes to the same first connector part 200.

FIG. 10A is the same view as FIG. 8C, which is a cross-sectional view of a connector assembly having a size of 2.92 mm, in which a second connector part 300 having an inner diameter of 2.92 mm of a ground connection part is coupled to the first connector part 200.

FIG. 10B is a cross-sectional view of a connector assembly having a size of 1.85 mm, in which a second connector portion 300' having an inner diameter of 1.85 mm of a ground connection part is coupled to the first connector portion 200.

FIG. 10C is a cross-sectional view of a connector assembly having a size of 2.40 mm, in which a second connector part 300" having an inner diameter of 2.40 mm of a ground connection part is coupled to the first connector part 200.

In the above-described embodiments of the present invention, the second connector part 300 is exemplified as being of a female type, but according to the embodiment, the second connector part 300 may be of a male type. In this case, the structure of the second signal pin 310, the second insulator (not shown), the second housing 340, or the fastening part 342 of the second connector unit 300 may be changed accordingly.

The connector assembly according to the embodiment of the present invention may facilitate electrical connection between a signal pin of a connector and a signal line of a circuit board.

In addition, the connector assembly according to the embodiment of the present invention is easily coupled to the side of the circuit board.

Further, the connector assembly according to the embodiment of the present invention is compatible with coaxial cables or coaxial connectors of various standards.

A number of examples have been described above. Nevertheless, it will be understood that various modifications may be made. For example, suitable results may be achieved if the described techniques are performed in a different order and/or if components in a described system, architecture, device, or circuit are combined in a different manner and/or replaced or supplemented by other components or their equivalents. Accordingly, other implementations are within the scope of the following claims.

What is claimed is:

1. A connector assembly coupled to a side of a circuit board, comprising:
   a first signal pin formed to be in contact with a signal line of the circuit board;
   a first insulator surrounding the first signal pin; and
   a first housing accommodating the first signal pin and the first insulator and having a hole at a rear thereof corresponding to the first signal pin,
   wherein the first housing comprises at least one clamping arm disposed on at least one side of the hole, protruding to a rear of the first housing, and having a lower surface formed to be in contact with an upper surface of the circuit board and the connector assembly further comprises
- a ground plate disposed below the clamping arm and having an upper surface formed to be in contact with a lower surface of the circuit board; a clamping plate movably disposed below the ground plate; and
- a fastening member configured to clamp the clamping plate and the clamping arm with the ground plate interposed therebetween.

2. The connector assembly of claim 1, wherein the first housing has an upper surface and a rear surface extending downward from the upper surface and the clamping arm is a predetermined distance below the upper surface and protrudes rearward from the rear surface.

3. The connector assembly of claim 1, further comprising an elastic member disposed below the clamping arm and across the ground plate and the clamping plate and disposed to push the ground plate and the clamping plate in opposite directions with a restoring force.

4. The connector assembly of claim 3, wherein the clamping arm comprises a first clamping arm and a second clamping arm respectively disposed on both sides of the hole, the fastening member comprises a first fastening member and a second fastening member that respectively clamp the first clamping arm and the second clamping arm and the clamping plate, and the elastic member comprises a first elastic member and a second elastic member respectively disposed below the first clamping arm and the second clamping arm.

5. The connector assembly of claim 4, wherein the ground plate comprises a first hole and a second hole through which the first fastening member and the second fastening member respectively pass, and a first groove and a second groove that are opened downward at positions corresponding to the first hole and the second hole, respectively, the clamping plate comprises a third hole and a fourth hole through which the first fastening member and the second fastening member respectively pass, and a third groove and a fourth groove that are opened upward at positions corresponding to the third hole and the fourth hole, respectively, the first elastic member is disposed across the first groove and the third groove, and the second elastic member is disposed across the second groove and the fourth groove.

6. The connector assembly of claim 5, wherein the first elastic member pushes an inner upper surface of the first groove and an inner lower surface of the third groove in opposite directions, and the second elastic member pushes an inner upper surface of the second groove and an inner lower surface of the fourth groove in opposite directions.

7. The connector assembly of claim 1, wherein the first signal pin has a rear end in contact with the signal line of the circuit board and the connector assembly further comprises:
- a second signal pin coupled to a front end of the first signal pin;
- a second housing accommodating the second signal pin and having a hole at a rear thereof corresponding to the second signal pin; and
- a coupling member configured to couple the first housing and the second housing.

8. The connector assembly of claim 7, wherein the first signal pin, the first insulator, the first housing, the clamping arm, the ground plate, and the clamping plate constitute a first connector part, the second signal pin and the second housing constitute a second connector part, and a different second connector part is coupled to the first connector part.

* * * * *